United States Patent
Neidich

(10) Patent No.: US 6,315,576 B1
(45) Date of Patent: *Nov. 13, 2001

(54) INTERPOSER ASSEMBLY

(75) Inventor: Douglas A. Neidich, Harrisburg, PA (US)

(73) Assignee: InterCon Systems, Inc., Harrisburg, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/753,734

(22) Filed: Jan. 2, 2001

Related U.S. Application Data

(63) Continuation-in-part of application No. 09/455,989, filed on Dec. 7, 1999, now Pat. No. 6,176,707, which is a continuation of application No. 09/287,896, filed on Apr. 7, 1999, now abandoned, which is a continuation-in-part of application No. 08/960,953, filed on Oct. 30, 1997, now abandoned.

(51) Int. Cl.⁷ .................................................. H01R 12/00
(52) U.S. Cl. ............................................. 439/66; 439/591
(58) Field of Search ................................ 439/66, 63, 68, 439/591, 71

(56) References Cited

U.S. PATENT DOCUMENTS

| | | | |
|---|---|---|---|
| 1,983,511 | 12/1934 | Johnson | 173/330 |
| 2,158,969 | 5/1939 | Oliver | 173/324 |
| 2,599,488 | 6/1952 | Sampson | 173/324 |
| 3,346,863 | 10/1967 | Siebold | 343/702 |
| 3,447,040 | 5/1969 | Denton, Jr. | 317/101 |
| 3,954,317 | 5/1976 | Gilissen et al. | 339/17 |
| 4,114,975 | 9/1978 | Weidler | 339/176 M |
| 4,354,729 | 10/1982 | Grabbe et al. | 339/258 R |
| 4,421,370 | 12/1983 | Treakle et al. | 339/59 M |
| 4,511,197 | 4/1985 | Grabbe et al. | 339/17 CF |
| 4,513,353 | 4/1985 | Bakermans et al. | 361/399 |
| 4,593,961 | 6/1986 | Cosmo | 339/61 M |
| 4,647,124 | 3/1987 | Kandybowski | 339/17 |
| 4,655,519 | 4/1987 | Evans et al. | 339/17 |
| 4,664,458 | 5/1987 | Worth | 339/17 |
| 4,678,252 | 7/1987 | Moore | 329/62 |
| 4,699,593 | 10/1987 | Grabbe et al. | 439/71 |
| 4,806,104 | 2/1989 | Cabourne | 439/66 |
| 4,891,023 | 1/1990 | Lopata | 439/637 |
| 4,906,194 | 3/1990 | Grabbe | 439/71 |
| 4,921,430 | 5/1990 | Matsuoka | 439/72 |
| 4,927,369 | 5/1990 | Grabbe et al. | 439/66 |
| 4,961,709 | 10/1990 | Noschese | 439/66 |
| 4,969,826 | 11/1990 | Grabbe | 439/66 |
| 4,998,886 | 3/1991 | Werner | 439/66 |
| 5,007,845 | 4/1991 | Grabbe | 439/73 |
| 5,015,191 | 5/1991 | Grabbe et al. | 439/71 |
| 5,017,158 | 5/1991 | Liu et al. | 439/609 |
| 5,030,144 | 7/1991 | Seidler | 439/876 |
| 5,092,783 | 3/1992 | Suarez et al. | 439/71 |
| 5,137,456 | 8/1992 | Desai et al. | 439/66 |
| 5,139,427 | 8/1992 | Boyd et al. | 439/66 |
| 5,152,694 | 10/1992 | Bargain | 439/66 |
| 5,152,695 | 10/1992 | Grabbe et al. | 439/71 |
| 5,167,512 | 12/1992 | Walkup | 439/66 |
| 5,184,962 | 2/1993 | Noschese | 439/66 |
| 5,199,889 | 4/1993 | McDevitt, Jr. | 439/66 |
| 5,230,632 | 7/1993 | Baumberger et al. | 439/66 |
| 5,259,769 | 11/1993 | Cruise et al. | 439/65 |

(List continued on next page.)

FOREIGN PATENT DOCUMENTS

WO 90/11629   10/1990   (WO) .

*Primary Examiner*—Renee Luebke
*Assistant Examiner*—Briggitte R. Hammond
(74) *Attorney, Agent, or Firm*—Thomas Hooker, P.C.

(57) ABSTRACT

An interposer assembly includes an insulating plate with passages extending through the thickness of the plate and projections extending into the passages. Metal contacts are confined in the passages by the projections. The contacts include noses that project outwardly from the plate for engagement with contact pads on overlying and underlying circuit members.

42 Claims, 9 Drawing Sheets

U.S. PATENT DOCUMENTS

| | | |
|---|---|---|
| 5,308,252 | 5/1994 | Mroczkowski et al. ............... 439/66 |
| 5,324,205 | 6/1994 | Ahmad et al. ......................... 439/66 |
| 5,338,232 | 8/1994 | Bernier ................................. 439/733 |
| 5,342,205 | 8/1994 | Hashiguchi ............................ 439/66 |
| 5,380,210 | 1/1995 | Grabbe et al. ......................... 439/66 |
| 5,395,252 | 3/1995 | White .................................... 439/66 |
| 5,403,194 | 4/1995 | Yamazaki .............................. 439/66 |
| 5,427,535 | 6/1995 | Sinclair ................................. 439/66 |
| 5,437,556 | 8/1995 | Bargain et al. ........................ 439/66 |
| 5,484,295 | 1/1996 | Mowry et al. ......................... 439/66 |
| 5,556,308 | 9/1996 | Brown et al. .......................... 439/746 |
| 5,573,435 | 11/1996 | Grabbe et al. ........................ 439/862 |
| 5,588,845 | 12/1996 | Naitoh et al. .......................... 439/66 |
| 5,588,846 | 12/1996 | Irlbeck et al. ......................... 439/66 |
| 5,628,639 | 5/1997 | Eichholz, Jr. et al. ................ 439/79 |
| 5,653,598 | 8/1997 | Grabbe .................................. 439/66 |
| 5,805,419 | 9/1998 | Hundt et al. .......................... 361/719 |
| 5,893,761 | 4/1999 | Longueville .......................... 439/66 |
| 5,913,687 | 6/1999 | Rathburn ............................... 439/66 |
| 5,938,451 | 8/1999 | Rathburn ............................... 439/66 |

INTERPOSER ASSEMBLY

This application is a continuation-in-part of application Ser. No. 09/455,989 filed Dec. 7, 1999, now U.S. Pat. No. 6,176,707, which is a continuation of now-abandoned application Ser. No. 09/287,896 filed Apr. 7, 1999 which is a continuation in-part of now-abandoned application Ser. No. 08/960,953 filed Oct. 30, 1997.

FIELD OF THE INVENTION

The invention relates to interposer assemblies used for forming electrical connections between spaced contact pads on circuit members.

DESCRIPTION OF THE PRIOR ART

Interposer assemblies form electrical connections between densely spaced contact pads on opposed parallel circuit members. Interposer assemblies are used wherever connections are required between very closely spaced or dense contact pads. The assemblies are well suited for use in electronic devices including computers, cell phones, digital assistants, notebook computers and the like. The assemblies enable a reduction in the size and weight of the electronic devices.

The pads on the circuit members are arranged in identical patterns. The interposer assembly includes an insulating plate and a plurality of through-contacts carried in the plate and arranged in the same pattern as the pads on the circuit members. The contacts project above the top and bottom sides of the plate. The interposer assembly is sandwiched between the two members which are held together with the contacts in the plate forming electric connections between aligned pairs of pads.

Interposer assemblies form electrical connections between contact pads arranged in a very close or dense proximity to each other. The pads may be arranged on a one millimeter center-to-center grid. Each assembly may have as many as 961 contacts. Four assemblies are conventionally mounted on a single frame with a total of 3,844 contacts in the frame.

In addition to requiring contacts which can be spaced very close to each other, the contacts must make reliable electrical connections with the pads when the assemblies are sandwiched between the circuit members. Failure of a single contact to make a reliable connection renders the entire frame useless.

The individual electrical contact in the assembly acts as a spring that extends or compresses in response to the circuit members moving away or towards one another. The contact is compressed and deforms elastically when sandwiched between the contact pads. The contact must be able to extend outwardly when the circuit members move apart and compress when the circuit members move back together.

Interposer assemblies must occupy a minimum width between the circuit members. This requires that the individual electrical contacts in the assembly have a limited height. Yet the contacts must possess the required resiliency for maintaining reliable electrical contact with the pads throughout repeated cycles of extension and compression.

Further, the contacts must be compressed with a low mechanical closure force when the interposer assembly is sandwiched between the circuit members. Low closure force is required in order to prevent undue stress on the contact or circuit member. A high closure force could distort or possibly break the contact or the circuit member. Permanent distortion or deformation of the contact member may reduce or destroy the resiliency of the contact. The contact cannot lose resiliency to the extent that the contact is unable to maintain reliable electrical connections between the pads.

Conventional interposer assemblies use contacts which occupy a relatively large amount of space in the supporting plate making it difficult to meet closely spaced grid requirements. These assemblies are relatively expensive to manufacture and assemble. Contacts may be accidentally displaced prior to sandwiching of the assemblies between circuit members.

SUMMARY OF THE INVENTION

The invention is an improved interposer assembly including metal through contacts confined in closely spaced passages extending through an insulating plate. The contacts are compact, permitting use of the assembly to form electrical connections between very closely spaced contact pads.

The contacts include spring portions which when compressed are elastically bent to form wiped pressure connections with opposed pads and reduce the force necessary to sandwich the interposer assembly between the circuit members. The resiliency of the spring portions maintains reliable electrical connections between the pads. The low closure force reduces the risk of damage to an overlying substrate and allows a large number of contacts in the assembly. The wiped electrical connections between the contacts and the circuit pads form low resistance electrical connections between the adjacent pairs of pads and permit installation of the interposer assemblies in user's facilities. The assemblies need not be installed in clean rooms.

The disclosed interposer assemblies use plates and contacts which are easily and inexpensively manufactured and assembled. The plate is a one-piece design and includes through passages with contact retention projections extending into the passages. The contacts each include a central portion and upper and lower spring arms joining the central portion and extending from the central portion to outer ends. Contact noses on the ends of the spring arms are normally spaced apart a distance greater than the thickness of the plate. Retention legs extend inwardly from the contact noses and away from the central portion to free ends of the contact.

The contacts are readily inserted into the passages to snap or latch over the projections. The projections cooperate with the contacts to hold the contacts in place in the passages prior to sandwiching of the assemblies between circuit members.

In a first embodiment each contact retention projection includes a sloped camming surface facing one side of the plate. The through contacts are inserted into the plate from the side adjacent the camming surfaces. During insertion, cam followers on the lead ends of the contacts engage the camming surfaces and are guided over the retention projections. When fully inserted, the retention projections extend between the free ends of the contacts. The contacts are loosely held in the passages. When compressed, the contacts establish reliable wiped contacts with opposed pads.

In a second embodiment each contact retention projection includes sloped camming surfaces provided on both sides of the projection. The camming surfaces extend to the adjacent walls of the contact passages and assure that during insertion of the contacts into the passages the lead ends of the contacts are guided smoothly over the projections and do not hang up in the corners or junctions between the projections and the adjacent walls.

The through contacts may be inserted from either side of the plate. During insertion, cam followers on the lead ends of the contacts engage camming surfaces and are guided past the projections which then hold the contacts in place.

When a contact is positioned in a through passage, rounded surfaces at the free ends of the contact are located adjacent the camming surfaces on opposite sides of the projection. The camming surfaces hold the contact loosely within the passage for floating engagement with opposed contact pads and formation of reliable wiped pressure connections with the pads. The free ends of the contacts are held within the thickness of the plate to limit contact float. When the assembly is sandwiched between the circuit members, the free ends of the contacts engage and then slide on the camming surfaces.

In third through fifth embodiments, the through contacts may also be inserted from either side of the plate. When the assembly is sandwiched between the circuit members, the free ends of the contacts do not engage the walls of the plate. The spring arms are free to extend or compress in response to the circuit members moving away or towards one without the ends of the contacts engaging the plate.

In the third through fifth embodiments each contact retention projection includes sloped camming surfaces provided on both sides of the projection to facilitate insertion of the contacts from either side of the plate. The central portion of each metal contact includes a retention recess and upper and lower retention portions on either side of the recess. After the contacts are inserted into the passages, the projections extend into the retention recesses to hold the contacts in the passages.

When sandwiching a third through fifth embodiment interposer assembly between the circuit members, the spring arms of each contact bend towards one another. The ends of the contact move inwardly towards the interior of the passage and away from the adjacent passage wall. When the interposer assembly is fully sandwiched between the circuit members, the contact is fully compressed and the free ends of the contact are spaced away from the passage walls. The spring arms act as cantilever springs extending from the central portion of the contact that are free to deflect without binding or rubbing in the passage to maintain reliable contact pressure against the contact pads despite slight shifting of the circuit members.

In the third embodiment the contacts are lightly squeezed when held in the passages. The resiliency of each contact presses the free ends of the contact against one passage wall and presses the upper and lower contact retaining portions against the opposite end wall. The contacts are effectively centered and confined within the passages regardless of the orientation of the plate. This assures that the contacts are dependably held in the plate during shipping and handling and prevents inadvertent dislodgment or escape of the contacts.

The fourth embodiment is similar to the third embodiment except that the contacts are loosely held in the passages and are not stressed until sandwiched between the circuit members.

The fifth embodiment is similar to the third embodiment and includes features that facilitate manufacture of the contacts. The contacts are typically stamped from extremely thin, uniform thickness strip stock. Forming the central recesses in such very small contacts can be difficult. To make the contacts easier to manufacture, the recesses in the fifth embodiment metal contacts are longer and shallower than are the recesses in the third embodiment contacts.

The contact retention projections include camming surfaces that are spaced closer to the adjacent top or bottom sides of the plate. This increases the length of the projections along the passages to correspond to the increased length of the contact recesses. The contact retention projections also do not extend into the individual passages as great a distance as does the third embodiment projections and fit in the shallow contact recesses.

In the fifth embodiment, each plate passage includes a second contact retention projection extending into the passage to confine a contact in the passage. The second projection faces the first projections across the passage and includes flat, shallow-sloped retention surfaces on both sides of the projection. When a contact is positioned in a through passage, the free ends of the contact engage the additional retention surfaces to center and hold the contacts in the passages despite the shallow contact recess.

In all embodiments, each passage has a uniform transverse cross section with the exception of the projections. The passage extends between opposed pairs of first and second end walls. The first end wall is adjacent a wide end of the passage and the second end wall has a reduced width and is adjacent a narrower end of the passage.

The projections can extend into the passages from either or both of the first and second end walls. In the first and second embodiments a single projection extends into the narrower end of each passage from the second end wall of the passage. In the third and fourth embodiments a single projection extends into the wider end of the passage from the first end wall of the passage. In the fifth embodiment a first projection extends into the wider end of the passage from the first end wall of the passage and a second projection extends into the narrower end of the passage from the second end wall of the passage.

Other objects and features of the invention will become apparent as the description proceeds, especially when taken in conjunction with the accompanying drawings illustrating the invention, of which there are nine sheets of drawings and five embodiments are disclosed.

DESCRIPTION OF THE PREFERRED EMBODIMENTS

Figure 1:
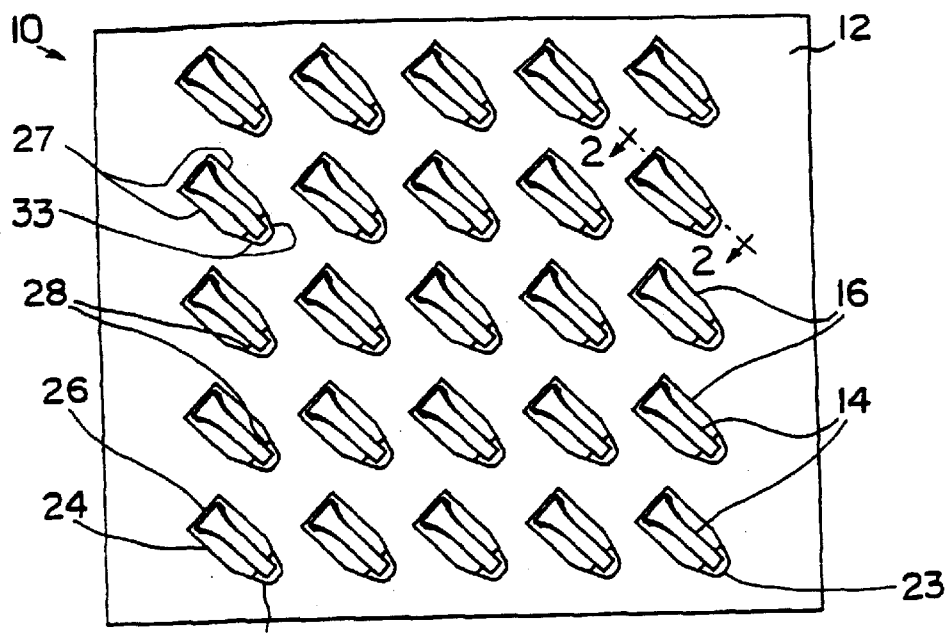
FIG. 1 is a top view of a first embodiment interposer assembly per the invention.
Figure 2:
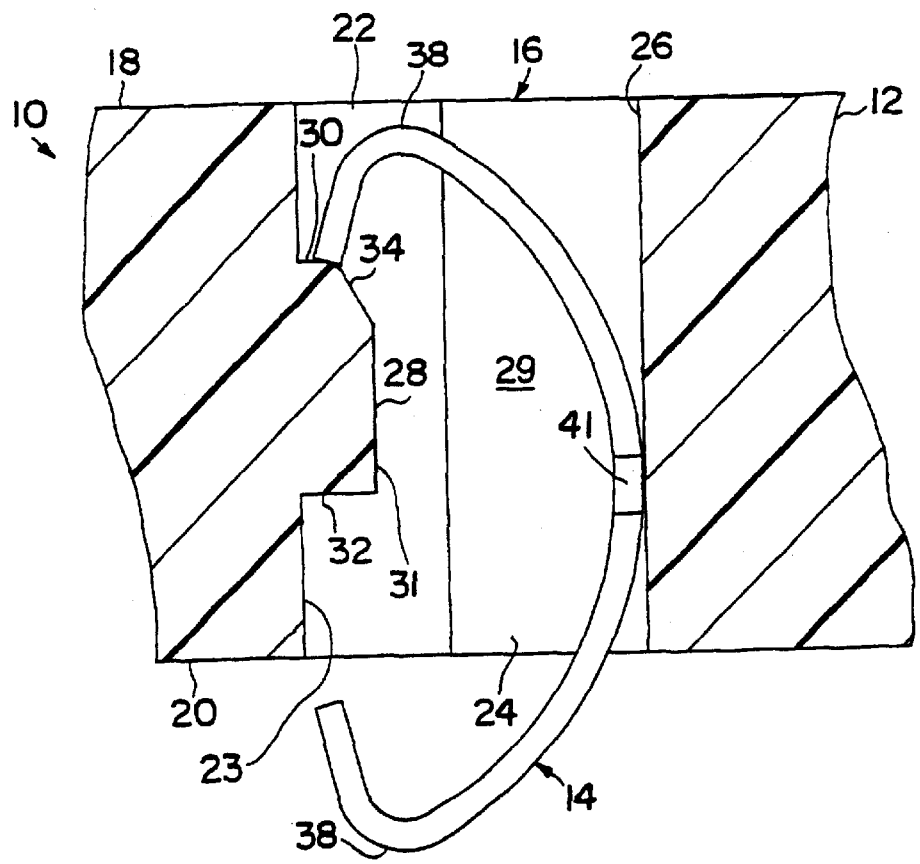
FIG. 2 is a sectional view taken along line 2—2 of FIG. 1.

First embodiment interposer assembly 10 includes a flat plate 12 formed of insulating material with a plurality of metal through contacts 14 positioned in contact passages 16 extending through the thickness of the plate between opposed plate top and bottom sides 18 and 20. One contact 14 is positioned in each passage 16. As shown in FIGS. 1 and 2, passages 16 are each provided with a reduced width portion 22 and a uniform width portion 24 away from portion 22. Opposed parallel side walls 27 join end wall 26 and extend along portions 24 to opposed converging side walls 33. Walls 33 extend along portions 22 to end walls 23. Flat end wall 26 extends across the uniform width portion 24 and is located opposite reduced width end wall 23. Wall 23 extends across the reduced width portion.

Contact retention projections 28 are provided in the reduced width portions 22 of passages 16. Projections 28 extend from walls 23 a distance into the passages and narrow and partially obstruct the passages at portions 29 between the projections and end walls 26. Narrow portion 29 extends from projection free end 31 to wall 26. The projections include contact retention surfaces 30 and 32 facing plate sides 18 and 20, respectively. The surfaces 30 and 32 are spaced in from the top and bottom sides of the plate. A sloped camming surface 34 extends from each retention surface 30 to the free end 31 of the projection 28 and faces top side 18. Surface 34 facilitates insertion of a contact 14 into passage 16.

Figure 5:
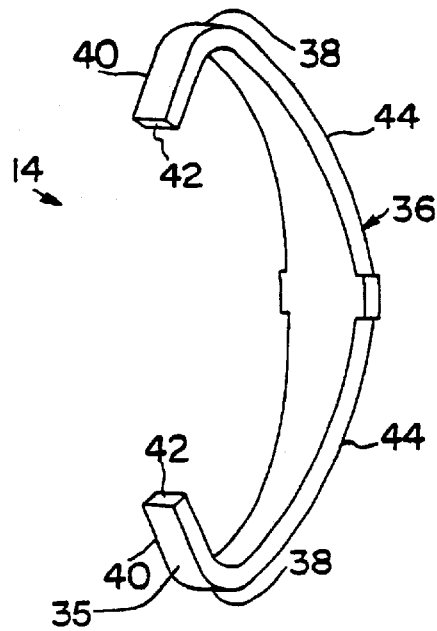
FIG. 5 is a perspective view of the contact shown in the assembly of FIG. 1.

Each metal contact 14 is preferably formed from uniform thickness strip stock, which may be suitably plated beryllium copper. The contact is generally C-shaped and includes an arcuate, convex spring 36 with a pair of opposed contact noses or pad contacts 38 at the ends of the spring. The center of spring 36 extends through narrow passage portion 29. The noses are spaced apart a distance greater than the thickness of the plate 12. Short retention legs 40 extend inwardly from the noses to free ends 42. The legs 40 extend away from spring 36 so that the noses 38 are located between the free ends 42 and the spring. As illustrated in FIG. 5, spring 36 has a maximum width at the center, midway between noses 38 and includes two tapered width spring arms 44 each extending from the center of the spring to a nose 38, in order to reduce stress concentration when the spring is stressed.

Passages 16 have a uniform transverse cross section, with the exception of projections 28. The interior surfaces defining end walls 26, side walls 27 and 33 and end walls 23 all extend perpendicularly to top and bottom sides 18 and 20. The major transverse width of passages 16 between walls 23 and 26 is approximately two times the minor transverse width of the passages at uniform width portion 24.

A single contact 14 is located in each passage 16 and extends across the major transverse width of the passage. See FIG. 2. With the contacts 14 in the passages 16, contact noses 38 on both ends of the contacts are located in regularly spaced perpendicular rows for forming electrical connections with corresponding pads on circuit elements to either side of the plate. See FIG. 1.

Figure 6:
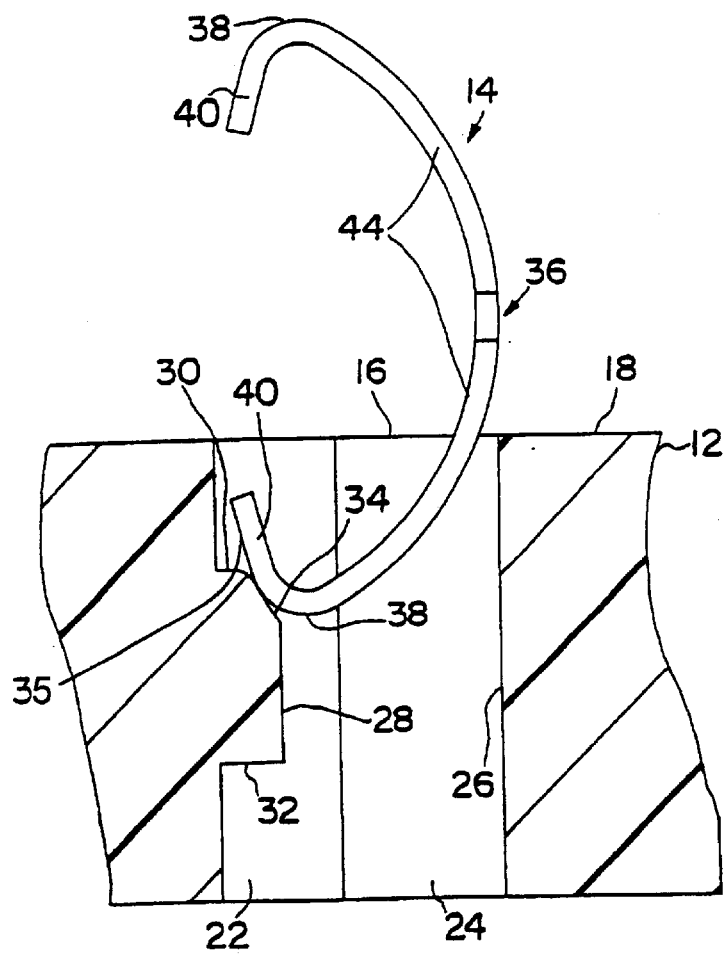
FIG. 6 is a sectional view illustrating insertion of the contact member of FIG. 5 into a passage extending through the plate.

Contacts 14 are inserted into passages 16 as shown in FIG. 6. One nose of the contact is extended into the end of the passage opening at plate top side 18 and is positioned in narrowed portion 29 between the projection 28 and wall 26. As contact 14 is inserted into the passage, surface 35 of the lower leg 40 serves as a cam follower and is guided by cam surface 34 to the end of the projection. Spring 36 engages wall 26. The contact is then inserted further into the passage with the result that the lower spring arm 44 is elastically stressed, leg 40 is moved past projection 28 and through narrowed portion 29 and snaps back under retention surface 32 of projection 28. With the contact inserted in passage 16 end 42 of the upper retention leg 40 is above the upper retention surface 30, end 42 of the lower retention leg 40 is located below the lower retention surface 32 and the center 41 of the arcuate spring is adjacent the flat wall 26. Spring 36 is bowed toward wall 26. The contact is loosely held in the passage between wall 23 and end wall 26 and with the projection between the ends 42 of the contact spring 36 at passage portion 29. The distance between the free ends 42 of legs 40 is greater than the height of projection 28, permitting limited free or float movement of the contact in passage 16. FIG. 2 illustrates the position of the contact in the passage when plate 12 is horizontal and the loose contact 14 is supported in the cavity against gravity with the end of the upper leg 40 resting on upper retention surface 30 of projection 28.

As illustrated in FIG. 1, the passages 16 are arranged close to each other in a dense array on plate 12 in order to permit forming electrical connections between similar arrays of contact pads on circuit elements located above and below the assembly. Conventionally, assembly 10 is used for forming electrical connections between contact pads on a ceramic integrated circuit and contact pads of a circuit board. The assembly may be used for forming electrical connections between contact pads on two circuit boards or between contact pads on other types of circuit members.

Figure 3:
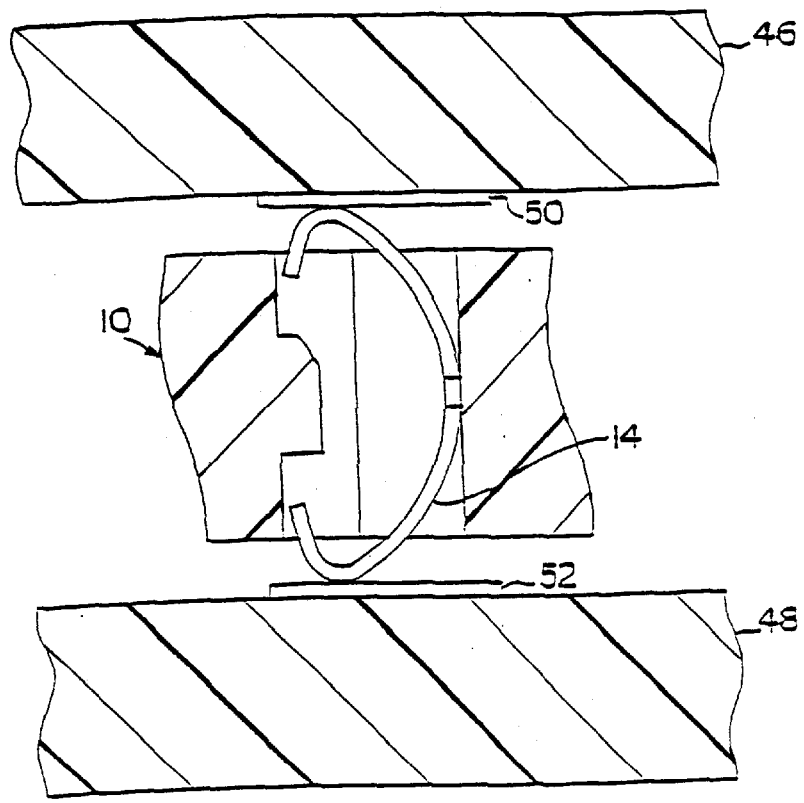
FIG. 3 is a sectional view illustrating the position of the assembly of FIG. 1 between two circuit members.

FIG. 3 illustrates the interposer assembly 10 positioned between upper and lower circuit members 46 and 48 with contact pads 50 and 52 on the members located above and below each contact in the assembly. The contacts lightly engage the pads and are not stressed.

Figure 4:
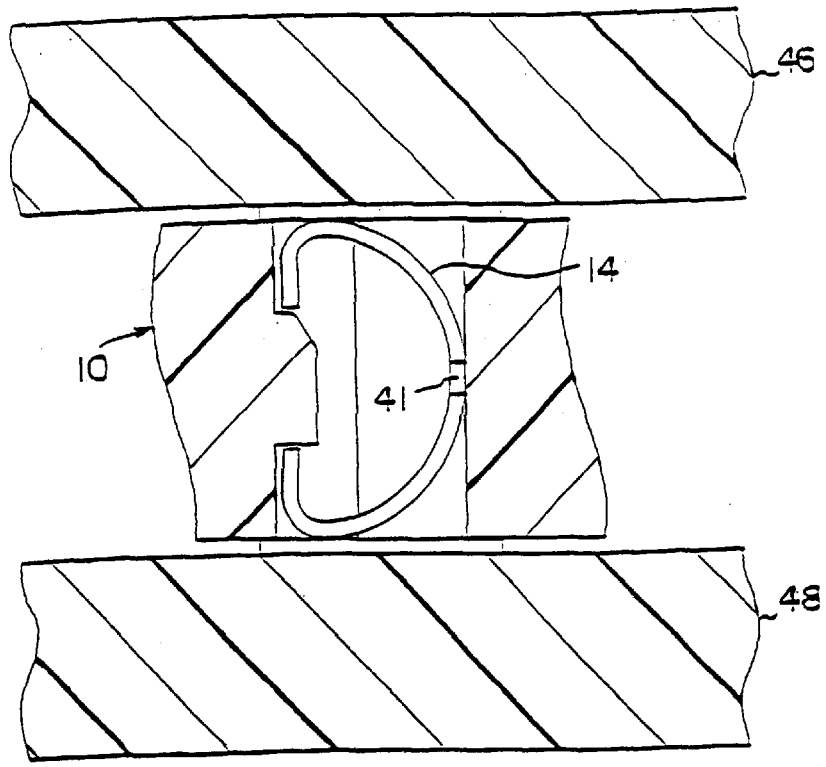
FIG. 4 is a view like FIG. 3 showing the assembly sandwiched between the circuit members.

FIG. 4 illustrates the assembly 10 when fully sandwiched between members 46 and 48 with the members held tightly against the plate 12. When the members are brought into contact with the assembly 10 the two contact pads 50 and 52 are moved together to reduce the height of contacts 14 and elastically bend the two tapered spring arms 44 of arcuate spring 36. The center of the spring engages the end wall 26 as shown in FIG. 4. Bending of the arcuate spring and foreshortening of the contact moves or wipes the contact noses 38 a distance along the contact pads toward wall 23 to make clean, low resistance pressure electrical connections between the contact noses 38 and the pads 50 and 52. The connections assure that the contact 14 provides a reliable, low resistance electrical path between the pads.

As illustrated in FIG. 4, foreshortening of contact 14 moves the free ends 42 of retention legs 40 together and brings the ends in close proximity to the retention surfaces 30 and 32 of projection 28. The retention legs do not engage the projection. Contact pressure is maintained by elastic bending of the spring 36 without bottoming of the ends of the contact on the projection or the walls of passage 16 which could undesirably increase the closing force.

Figure 7:
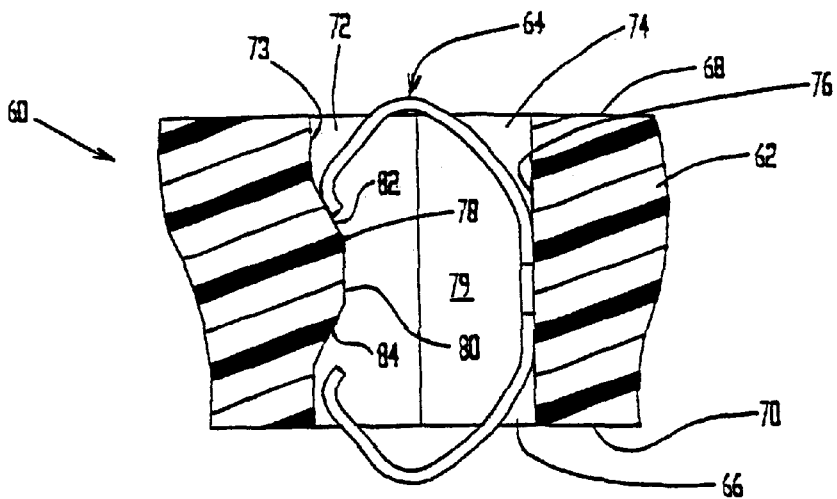
FIG. 7 is a sectional view of the second embodiment like FIG. 2.

FIGS. 7–12 illustrate a second embodiment interposer assembly 60. Interposer assembly 60 includes a flat plate 62 formed of insulating material with a plurality of metal through contacts 64 positioned in contact passages 66 extending through the thickness of the plate between opposed plate top and bottom sides 68 and 70. As shown in FIG. 7, passages 66 are each provided with a reduced width portion 72, like passage portion 22 in the plate 12 passages, and a uniform width portion 74 away from portion 72. Flat end wall 76 extends across the uniform width portion 74 and is located opposite reduced width end wall 73. Wall 73 extends across the reduced width portion.

Contact retention projections 78 are provided in the reduced width portions 72 of passages 66. Projections 78 extend a distance into the passages and narrow the passages at portions 79 between the projections and walls 76. Each projection 78 extends into portion 72 to an inner free end 80 spaced from wall 76 and facing the narrowed passage portion 79. The projections 78 are centered in the passages 66 between the top and bottom sides of the plate.

Figure 8:
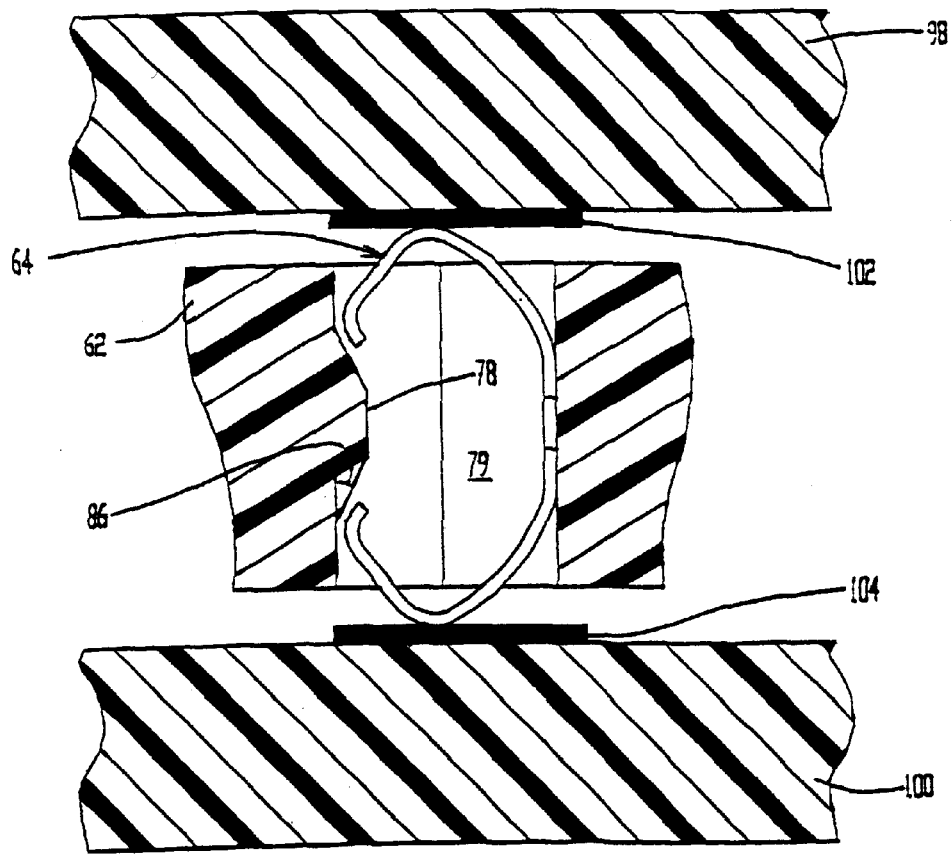
FIG. 8 is a sectional view illustrating the position of the assembly of FIG. 7 between two circuit members.

The projections 78 include sloped upper and lower camming surfaces 82 and 84 facing plate top and bottom 68 and 70, respectively. The camming surfaces 82 and 84 are spaced in from the top and bottom sides of the plate. Each upper camming surface 82 faces top side 68 and extends from wall 73 towards bottom side 70 to the inner end 80. Each lower camming surface 84 faces bottom side 70 and extends from wall 73 towards top side 68 to the inner end 80. As shown in FIG. 8, the upper and lower camming surfaces 82 and 84 are smooth, generally planar and slope at an angle 86 with respect to the axis of passage 66. Angle 86 is preferably about 25 degrees. Camming surfaces 82 and 84 facilitate insertion of contact 64 into passage 66 from either the top or bottom side of plate 62.

The contact 64 is arcuate and includes a flat central portion or spine 88 and upper and lower tapered spring arms 90 extending from the ends of spine 88. Curved contact noses or pad contacts 92 are provided on the outer ends of arms 90. Retention legs 94 extend inwardly from the noses to rounded free ends 96. The contact noses 92 are spaced apart a distance greater than the thickness of the plate 62. The legs 94 extend away from spine 88 so that the noses 92 are located between the ends 96 and the spine.

Each metal contact 64 is preferably formed from the same stock as metal contacts 14. The through contacts 14 used in first embodiment assembly 10 and through contacts 64 used in the second embodiment assembly 60 are each bent from identical flat preforms punched from thin strip metal stock, as previously described.

Figure 12:
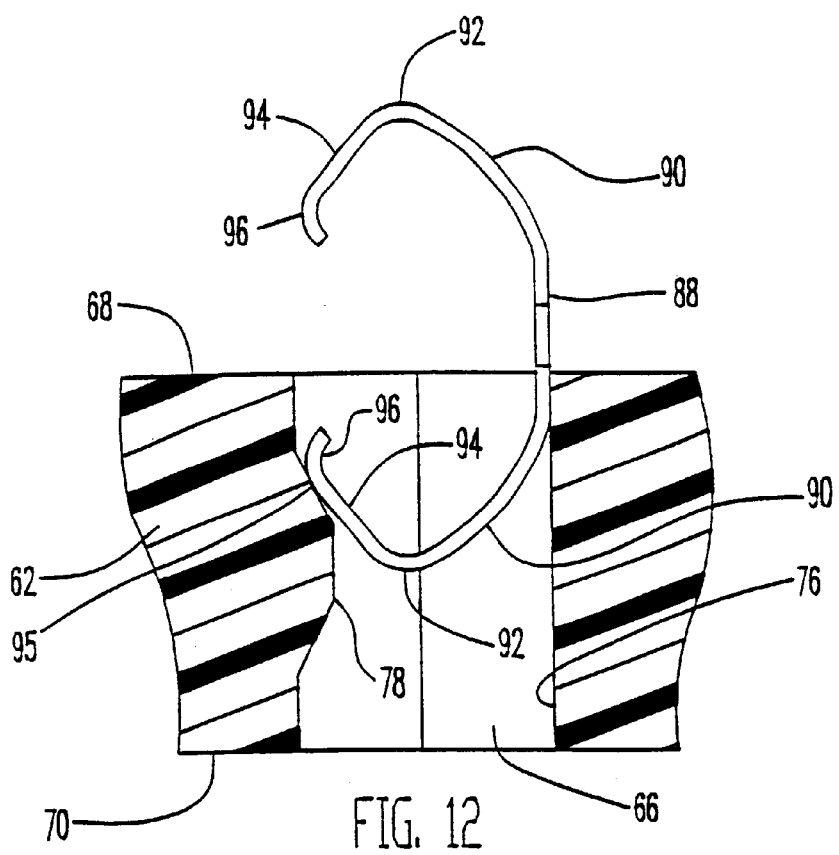
FIG. 12 is a sectional view illustrating insertion of the contact member of FIG. 11 into a passage extending through the plate.

Contacts 64 are inserted into passages 66 as shown in FIG. 12. One nose 92 of the contact is extended into the end of the passage opening at plate top side 68 and is positioned between the projection 78 and wall 76. As the contact is inserted into the passage, surface 95 on the lower leg 94 serves as a cam follower and is guided by upper camming surface 82 to the end of the projection. Spine 88 slides along wall 76. The upper camming surface 82 extends smoothly from wall 73 so that contact 64 does not bind or catch between projection 78 and wall 73 when leg 94 engages the projection 78.

The contact is then moved further into the passage and the lower spring arm is elastically stressed as lower leg 94 moves past projection 78 and then snaps back under lower camming surface 84. With the contact inserted in passage 66 the spring arms 90 are bowed out from wall 76 with the upper end 96 located above upper camming surface 82 and the lower end 96 located below the lower camming surface 84. The spine 88 of the contact center portion is adjacent the flat wall 76. In this position, the contact 64 is loosely confined within passage 66 with both free ends 96 located within the thickness of the plate 62. Confinement of the free ends within the thickness of the plate assures that, on collapse, the height of the contact is reduced as described without capture of a free end on one side of the plate. Such capture would prevent the contact from forming a reliable electrical connection between opposed pads. The convex side of each free end 96 faces the adjacent camming surface 82 or 84.

If desired, contacts 64 could be inserted into the plate from the bottom side 70 in the same manner as previously described.

Contacts 64 are loosely held in passage 66. Projections 78 extend between contact ends 96. The distance between ends 96 is greater than the height of projections 78 between the ends 96, permitting limited free movement or float of the contacts in passages 66. FIG. 7 illustrates the position of the contact in the passage when plate 62 is horizontal and the loose contact 64 is supported in passage 66 against gravity. The upper curved end 96 of the upper leg 94 rests on the upper camming surface 82 of projection 78 and the lower curved end 96 of the lower leg 94 remains in the passage. Spine 88 engages wall side 76 and maintains the contact in substantially vertical alignment in the passage.

Spine 88 also resists rocking or rotation of the contact in a clockwise or counterclockwise direction as viewed in FIG. 7. Rocking of the contact is also limited by the proximity of the contact ends 96 to side 72 and camming surfaces 82 and 84. The loose confinement of the contact in the passage assures that the contact is in position to be collapsed to form a reliable connection between opposed pads.

Passages 66 are arranged close to each other in a dense array in plate 62 in the same manner as passages 16 are arranged in plate 12.

FIG. 8 illustrates the interposer assembly 60 positioned between upper and lower circuit members 98 and 100 with contact pads 102 and 104 on the members located above and below contacts in the assembly. The contacts lightly engage the pads and are not stressed.

Figure 9:
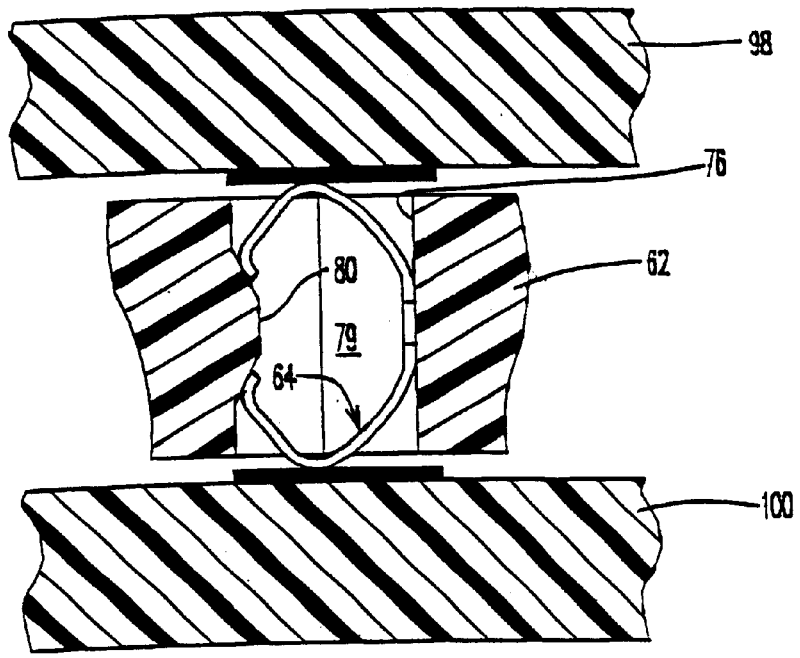
FIG. 9 is a view like FIG. 8 showing the assembly partially sandwiched between the circuit members.
Figure 10:
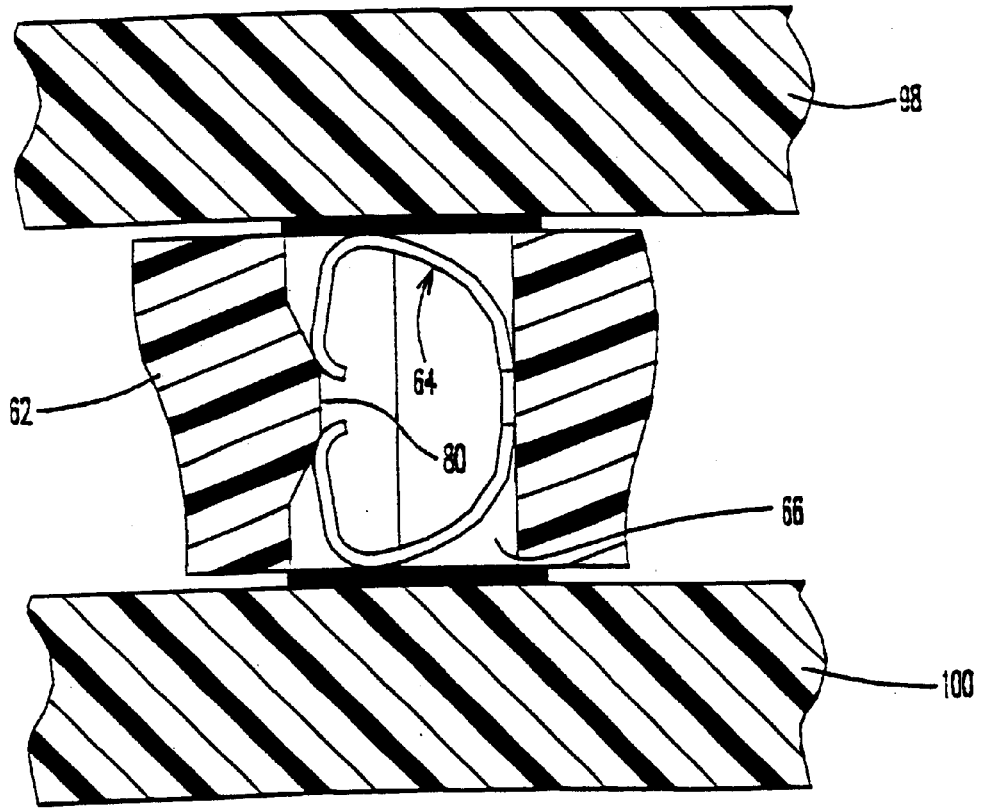
FIG. 10 is a view like FIG. 8 showing the assembly sandwiched between the circuit members.
Figure 11:
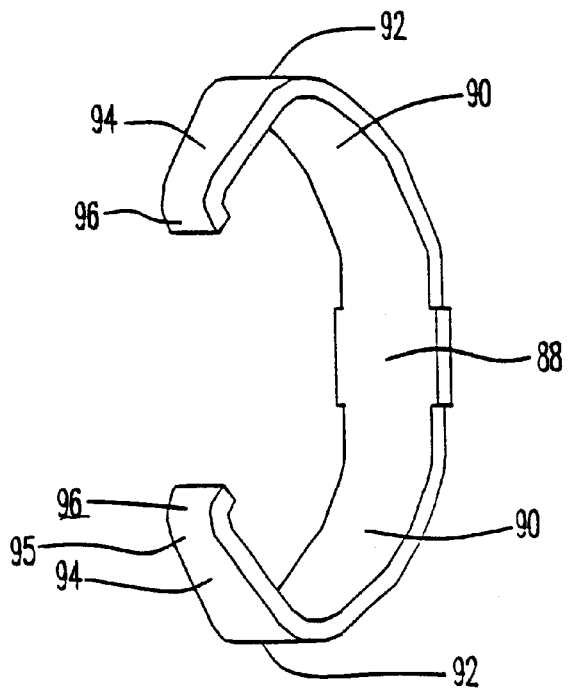
FIG. 11 is a perspective view of the contact shown in the assembly of FIG. 7.

FIG. 9 illustrates the assembly 60 when partially sandwiched between members 98 and 100. When the members are brought toward assembly 60 the two contact pads 102 and 104 are moved together to reduce the height of contacts 64 and elastically bend the two tapered spring arms 90. The curved ends 96 of retention legs 94 move towards each other and towards wall 76. The upper and lower curved ends 96 contact upper and lower camming surfaces 82 and 84 respectively as shown in FIG. 10. After contact, each curved end 96 slides along the camming surface towards projection inner end 80. The curved ends 96 roll slightly on the camming surfaces and maintain tangential engagement with the camming surfaces as the legs slide inwardly toward the free end of the projection. Spine 88 remains flush on wall 76. Contact noses 92 are wiped along the contact pads toward wall 73.

FIG. 10 illustrates the assembly 60 when fully sandwiched between members 98 and 100 with the members held tightly against the assembly plate 62. When the members are brought into contact with the assembly 60 contact pads 102 and 104 reduce the height of contacts 64 to a minimum and further elastically bend spring arms 90. The upper and lower curved ends 96 remain engaged with the camming surfaces near projection inner end 80. The contact spine 88 remains on wall 76. Contact noses 92 have moved further along the contact pads to their position nearest wall 73. The movement or wiping of contact noses 92 along the contact pads make clean, low resistance pressure electrical connections between the contact noses 92 and the pads 102 and 104.

As illustrated in FIG. 10, foreshortening of contact 64 moves the curved end portions 96 of retention legs 94 together and brings the ends into engagement with camming surfaces 82 and 84 of projection 78. Contact pressure is maintained by elastic bending of contact 64 despite engagement of the end portions of the contact with the projection. The slope of the camming surfaces and the curved contact end portions allow the contact to deform without binding on the projection, which could undesirably increase the closing force or permanently deform the contact.

FIGS. 13 to 18 illustrate a third embodiment interposer assembly 110 in accordance with the present invention. The interposer assembly 110 includes an integral, one-piece interposer component realized as a flat plate 112 formed of insulating material with a plurality of metal through contacts 114 positioned in contact passages 116 extending through the thickness of the plate. The passages 116 extend between opposed plate top and bottom sides or surfaces 118 and 120. A single contact 114 is located in each passage 116.

The passages 116 each have an elongate transverse cross section with opposed passage ends. See FIG. 15. One passage end is wider than the other passage end, with an end wall 122 at the wide passage end and a reduced width end wall 124 at the other, narrower passage end. The width of the end wall 122 is greater than the width of the end wall 124. A pair of opposed parallel walls 126, 128 join the end wall 122 and extend toward the narrow end wall 124. A pair of opposed converging walls 130, 132 join the parallel walls and extend to the end wall 124. The parallel walls 126, 128 define a uniform width portion 134 of the passage 116 adjacent the wide end of the passage and the converging walls 130, 132 define a reduced width portion 136 of the passage 116 adjacent the narrow end of the passage. The passage walls all extend perpendicularly to the top and bottom sides of the plate. For the illustrated embodiment, the distance between the end walls 122, 124 is approximately two times the distance between the parallel walls 126, 128.

Contact retention projections 138 are integrally formed from the insulating material and extend into the passages 116. Each projection 138 is located within a passage 116 and extends from one end of the passage a distance into the passage towards the opposite end of the passage. As shown, each projection 138 extends from the wider passage end wall 122 into the uniform width portion 134 of the passage. The projection 138 extends a distance into the passage and narrows and partially obstructs the passage at a narrowed passage portion 140 between the projection and the opposite end wall 124. The projection 138 extends from the end wall 122 to an inner free end 142 spaced from the end wall 124 and facing the narrowed passage portion 140.

Each projection 138 is centered in the passage 116 equidistant between the top and bottom sides of the plate. The end 142 of the projection extends completely across the passage between the parallel side walls 126 and 128.

The projections 138 include sloped upper camming surfaces 144 and lower contact retention surfaces 146. See FIG. 16. The camming surfaces 144 face the top side 118 of the plate and slope from the projection ends 142 towards the top side of the plate. The contact retention surfaces 146 face the bottom side 120 of the plate. The surfaces 144 and 146 are spaced a distance in from the top and bottom sides of the plate, with the projection ends 142 located between the surfaces. Each upper camming surface 144 extends from the end wall 122 towards the bottom side 120 to the inner end 142. Each lower retention surface 146 extends from the end wall 122 towards the top side 118 to the inner end 142.

Figure 16:
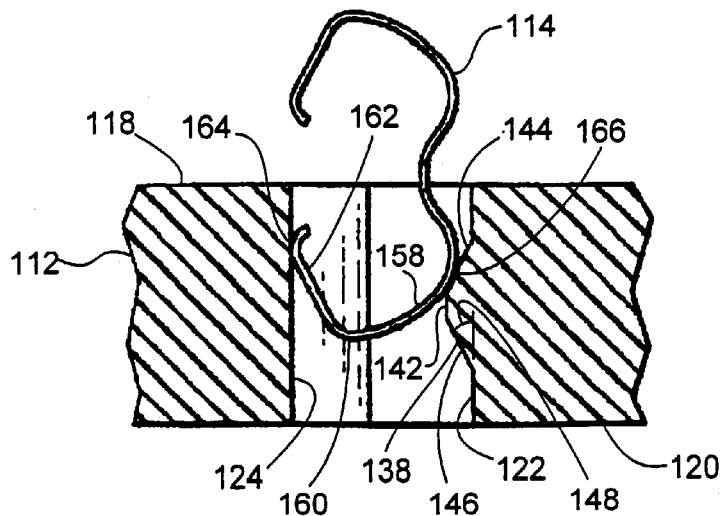
FIG. 16 is a view similar to FIG. 13 illustrating insertion of the contact member into the passage.

As shown in FIG. 16, the passages 116 and the projections 138 are symmetrical to either side of a plane parallel to and equidistant between the plate top and bottom sides 118, 120. The camming and retention surfaces 144 and 146 are flat, generally planar surfaces and slope at an angle 148 with respect to the axis of the passage 116. Angle 148 is preferably about 27 degrees. Camming and retention surfaces 144 and 146 facilitate insertion of a contact 114 into passage 116 from either the top or bottom side of the plate 112.

The metal contacts 114 are preferably formed from the same stock as metal contacts 14 and 64. The contacts 114 are each bent from identical flat preforms punched from thin metal stock, as previously described.

Each contact 114 is arcuate and includes a central portion 150 having a retention recess 152 and upper and lower retention portions 154 on either side of the retention recess 152. Upper and lower spring members 156 join the central portion 150 and include bowed, tapered spring arms 158 that extend away from the central portion 150 to outer ends. Curved contact noses or pad contacts 160 are provided on the outer ends of the arms 158. The contact noses 160 are spaced apart a distance greater than the thickness of the plate 112. Legs 162 extend inwardly from the noses to rounded free ends 164. The legs 162 extend away from the central portion 150 so that the noses 160 are located between the ends 164 and the central portion 150 and the transverse width of the contact 114 is greater than the distance between the passage end walls 122 and 124. Cam followers 166 are located on the spring arms 158. The contacts 114 are symmetrical to either side of the central portions 150.

Contacts 114 are inserted into passages 116 as shown in FIG. 16. One nose 160 of each contact 114 is extended into the end of an individual passage opening at plate top side 118 and is positioned between the projection 138 and the reduced width end wall 124. The lower spring arm 158 and lower leg 162 are located in the passage 116 with the rounded end 164 of the lower leg adjacent the passage wall 124. The contact 114 is moved into the passage 116 and the lower leg 162 engages the upper end of the passage wall 124 and is elastically bent inwardly to enable the free end 164 of the lower leg to enter the passage 116. The rounded end 164 assures that the lower leg moves into the passage without binding or catching on the upper side of the plate.

The cam follower 166 on the lower spring arm 158 is guided by the upper camming surface 144 to the end of the projection. The upper camming surface 144 extends smoothly from end wall 122 so that the lower spring arm 158 does not bind or catch between the projection 138 and the end wall 122 when the cam follower 166 engages the projection 138. The rounded end 164 of the lower contact leg 162 slides smoothly along the end wall 124 and does not bind or catch.

The contact is then moved further into the passage and the lower spring arm 158 is elastically stressed as the lower cam follower 166 moves past projection 138 and then snaps back under lower contact retention surface 146. At the same time the upper leg 162 moves into the passage 116. The rounded end 164 on the upper leg 162 assures the leg moves into the passage without catching on the upper side of the plate.

Figure 13:
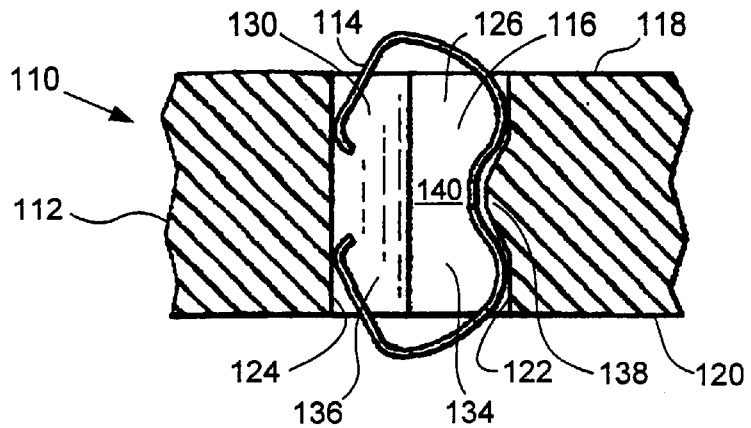
FIG. 13 is a vertical sectional view of a portion of a third embodiment interposer assembly per the invention illustrating a contact member in a plate passage.
Figure 15:
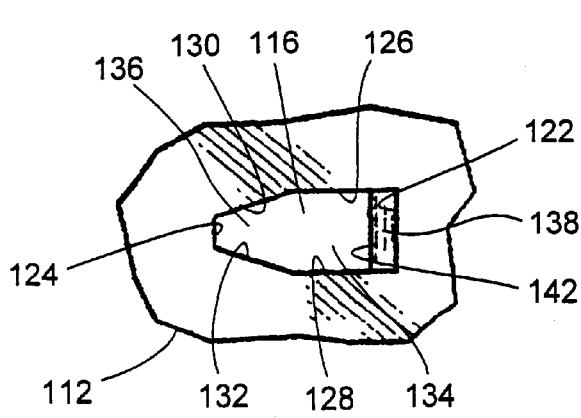
FIG. 15 is a view like FIG. 14 but without the contact member in the passage.

As shown in FIG. 13, with a contact 114 inserted in a passage 116 the retention projection 138 extends into the retention recess 152. The central portion 150 of the contact overlies the free end 142 of the projection 138. The projection is located between the upper and lower contact retention portions 154 to confine the contact in the passage 116. The contact is squeezed or elastically compressed in the passage between the end walls 122 and 124 with the free ends 164 of the upper and lower legs 162 held against end wall 124 and the upper and lower contact retaining portions 154 against the end wall 122. The contact retaining portions engage the end wall 122 short distances above and below the projection 138 to effectively center the contact 114 in the passage 116. In other possible embodiments the central portion 150 may engage the projection surfaces 144 and 146 or the end of the projection to locate the contact in the passage. The contact legs and spring arms are elastically stressed. The upper and lower cam followers 166 face away from the lower and upper projection surfaces 146 and 144 respectively.

In this position, the contacts 114 are held centered in passages 116 regardless of the orientation of the plate 112. Each contact makes four-point engagement with the interior walls of a passage, with the two retaining portions 154 engaging the end wall 122 and the two contact legs 162 engaging the end wall 122. The four-point engagement of the contacts 114 in the passages 116 provides greater stability and more positive retention of the contacts in the passages and prevents accidental displacement of the contacts prior to sandwiching the assembly between circuit members. The contacts are held in proper positions in the plate to be sandwiched between two circuit members. The stressed confinement of the contacts against the passage end walls assures that the contacts are dependably held in the plate during shipping and handling and prevents inadvertent dislodgment or escape of the contacts. Both free ends 164 are located within the thickness of the plate 112. The convex side of each free end 164 engages the adjacent end wall 124.

If desired, contacts 114 could be inserted into the plate from the bottom side 120 in the same manner as previously described.

Figure 14:
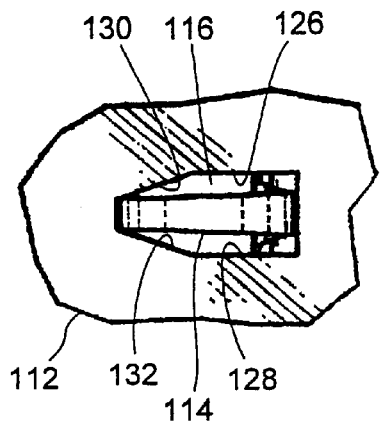
FIG. 14 is a top view of the assembly shown in FIG. 13.

As shown in FIG. 14, each contact 114 is also in close proximity to the passage side walls 126, 128 and 130, 132 to maintain the contacts in substantially vertical alignment in the passages. The close proximity of the contacts 114 to the passage walls and projections also limits rocking of the contacts.

Passages 116 are arranged close to each other in a dense array on plate 112 in the manner previously described for passages 16 in the plate 12 to permit forming electrical connections between similar arrays of contact pads on circuit elements located above and below the assembly. The assembly may be used for forming electrical connections between contact pads on two circuit boards or between contact pads on other types of circuit members.

Figure 17:
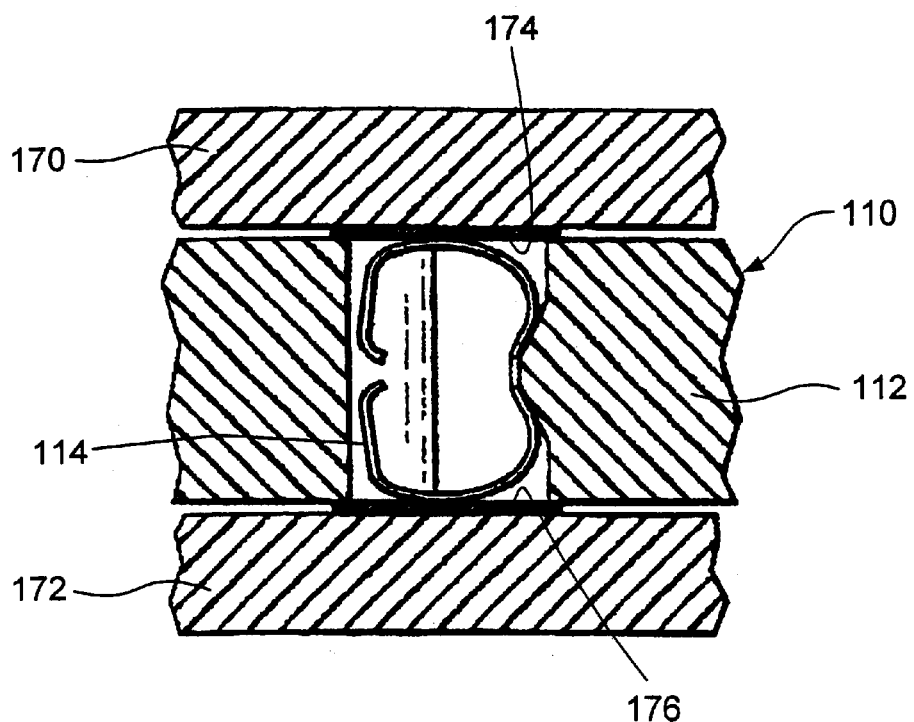
FIG. 17 is a view like FIG. 13 but illustrating the assembly sandwiched between a pair of circuit members.

FIG. 17 illustrates the interposer assembly 110 fully sandwiched between upper and lower circuit members 170 and 172 with contact pads 174 and 176 on the members located above and below contacts in the assembly. When the members are brought toward assembly 110, the two contact pads 174 and 176 are moved together and engage the upper and lower contact noses 160 respectively to apply a closure force to the contact noses located on the ends of the contact spring arms 158.

The closure force urges the contact noses 160 towards each other to compress and reduce the height of the contacts 114. Compression of the contacts 114 is at first resisted by the initial compression or preloading of the spring arms 158 in the contact passages 116. The closure force overcomes the initial preloading of the spring arms and moves the contact noses 60 towards each other and compresses the contacts. The pairs of tapered spring arms 158 elastically bend to reduce the height of the contact 114.

As a contact compresses, the upper and lower spring arms 158 deflect towards each other. The outer ends of the spring arms move inwardly towards the central portion of the contact. The contact legs 162 move inwardly with the outer ends of the cantilever spring arms 158. The free ends 164 of the contact legs disengage and move away from the end wall 124. The arms 158 are bent into the passage 116 about central portion 150. Contact retaining portions 154 are bent away from end wall 122. The central portion 150 presses against the end of the projection 138. Contact noses 160 are wiped along the contact pads toward end wall 124 to make dependable wiped electrical connections.

When the circuit members are brought into contact with the assembly 110 the contact pads 174 and 176 reduce the height of the contacts 114 to a minimum and further elastically bend the tapered, cantilever spring arms 158. The upper and lower contact ends 164 are spaced away from the end walls and do not contact the interior walls of the passages 116. See FIG. 17.

Contact pressure is maintained by the resiliency of the spring arms 158. In this position the spring arms 158 are tapered cantilever springs extending from the central portion of the contact to a free end at the contact nose. Elastic bending of the spring arms press the contact noses against the contact pads. The resiliency of the spring arms enable the spring arms to extend outwardly when the when the circuit members move apart and compress when the circuit members move back together. The ends 164 of the contacts remain spaced from the interior walls of the passages 116 and do not engage or rub against the passage walls. This enables the spring arms to deflect freely and without binding or rubbing of the contact ends to maintain reliable electrical contact with the pads throughout repeated cycles of extension and compression. Extension and compression of the circuit members relative to the interposer assembly can occur due to thermal expansions and contractions of the members and assembly.

Figure 19:
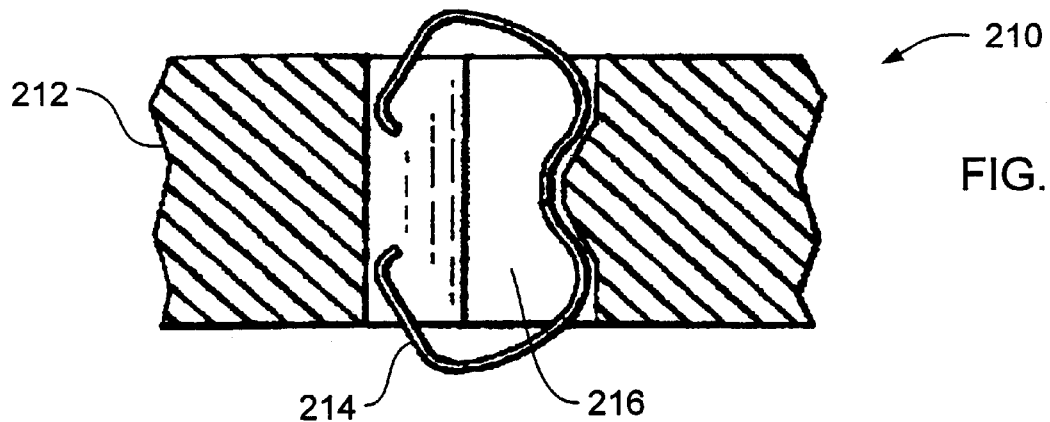
FIG. 19 is a view similar to FIG. 13 of a fourth embodiment interposer assembly per the invention.

FIG. 19 illustrates a fourth embodiment interposer assembly 210 in accordance with the present invention. The interposer assembly 210 includes an integral, one-piece plate 212, like plate 112, having a plurality of metal through contacts 214 held in through contact passages 216. The contacts 214 are similar to the contacts 114 except that the contact legs extend from the spring arms such that the transverse width of each contact 114 is less than the distance between the pairs of passage end walls.

The contacts 214 are inserted into individual passages 216 essentially in the same manner as the contacts 114. FIG. 19 illustrates the position of a contact 214 in a passage 216 when plate 212 is horizontal and the inserted contact 214 is centered in the passage. As shown, after the lower spring arm moves past the projection and then snaps back under the projection retention surface, the contact 214 is loosely confined within the passage. The inserted contacts 214 are not squeezed between the passage end walls and are not stressed. A plate projection, like projection 138, extends into a retention recess to confine a contact 214 loosely in the passage with both free ends of the contact located within the thickness of the plate 212. The loose confinement of the contacts assures that the contacts are in position to be collapsed to form a reliable connection between opposed pads. Each contact 214 is held in close proximity to the passage end walls and side walls to maintain the contact 214 in substantially vertical alignment in the passage 216.

Figure 18:
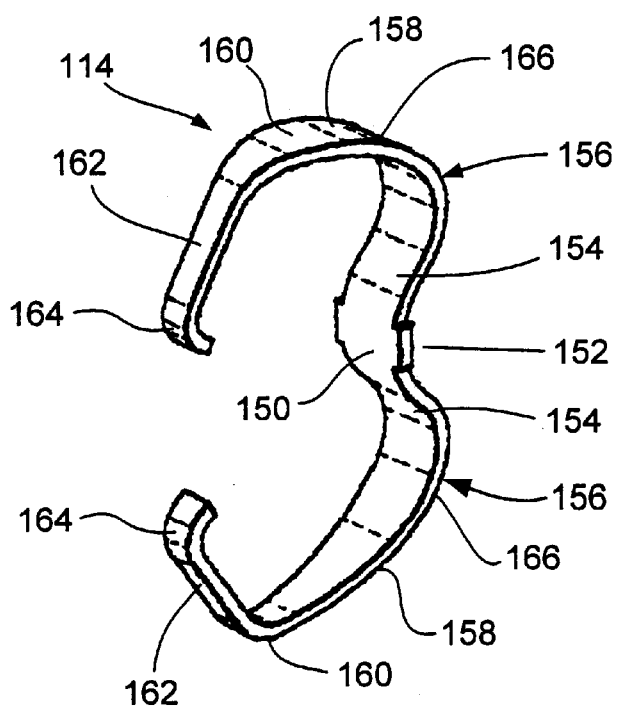
FIG. 18 is a perspective view of the contact shown in the assembly of FIG. 13.

When the interposer assembly 210 is sandwiched between circuit members, the contacts 214 are compressed and assume essentially the same configuration as the contacts 114 shown in FIG. 18. The ends of the contacts are spaced from the passage walls and do not contact the interior passage walls to enable the spring arms to maintain reliable low resistance pressure connections between contact pads as previously described.

Figure 20:
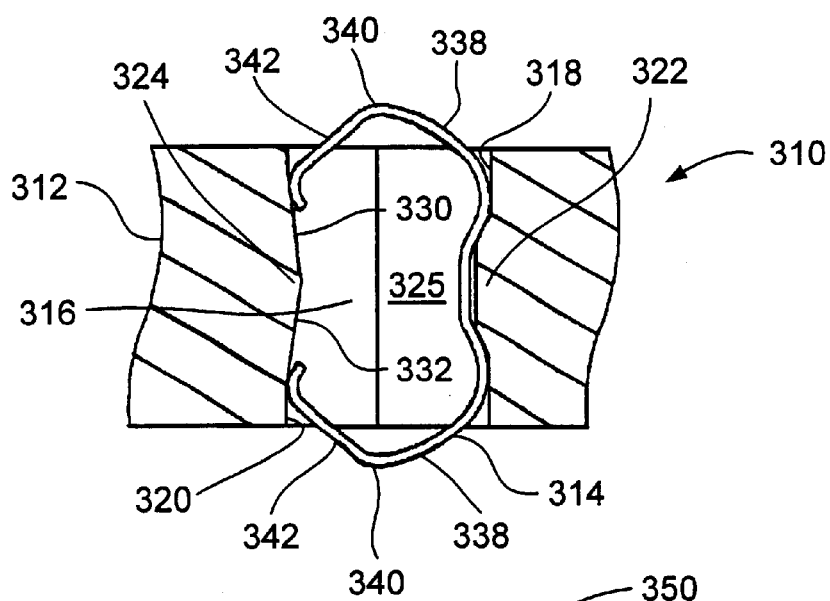
FIG. 20 is a vertical sectional view of a portion of a fifth embodiment interposer assembly per the invention.
Figure 21:
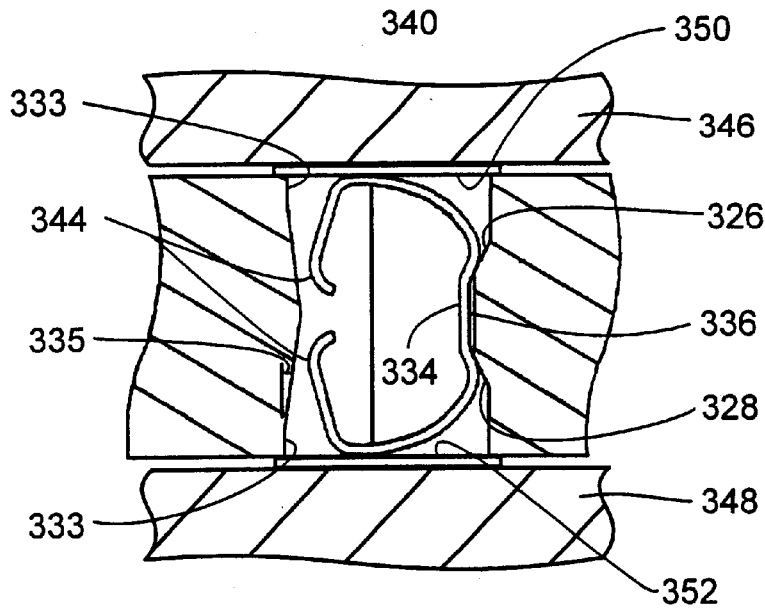
FIG. 21 is a view similar to FIG. 20 but illustrating the assembly when sandwiched between a pair of circuit members.

FIGS. 20 and 21 illustrate a fifth embodiment interposer assembly 310 in accordance with the present invention. The assembly 310 is similar to assembly 110 but has features that enable the contacts to be more easily manufactured and more positively retained in the passages. In the previously described assembly 110, a projection 138 in the typically has a height or length extending along the passage wall 122 of about 0.048 inches. The length and depth of the contact recess 152 should closely conform to the shape of the projection so that the projection snuggly fits in the recess to reliably hold the contact in the passage. Typically the contacts 114 are stamped from very thin foil material, which may be only 0.0017 inches thick. Forming the contact recesses from such thin foil within acceptable manufacturing tolerances may be difficult. It is desirable that the contacts be more easily manufactured.

The interposer assembly 310 includes an integral, one-piece insulating plate 312 similar to the plate 112. A plurality of metal through contacts 314, similar to the contacts 114, are positioned in contact passages 316 extending through the thickness of the plate.

Each passage 316 has an elongate transverse cross section, like a passage 116, with opposed passage ends. One passage end is wider than the other passage end. End wall 318 is at the wide passage end and reduced width end wall 320 is at the other, narrower passage end. The width of the end wall 318 is greater than the width of the end wall 320. A pair of opposed parallel walls join the end wall 318 and extend toward the narrow end wall 320. A pair of opposed converging walls join the parallel walls and extend to the end wall 320. The passage walls all extend perpendicularly to the top and bottom sides of the plate.

First and second contact retention projections 322 and 324 are integrally formed from the insulating material and extend into the passage 316. Each projection 322 and 324 is located within the passage and extends from an end wall 318 or an end wall 320 respectively a distance into the passage towards the other to define a reduced-width passage portion 325. The projections 322, 324 are centered in the passage 316 equidistant between the top and bottom sides of the plate and extend completely across the passage between the passage side walls.

Each contact projection 322 is generally similar to a contact projection 138 and includes a sloped upper camming surface 326 and a sloped lower contact retention surface 328. Camming and retention surfaces 326 and 328 are generally planar and are similar to camming and retention surfaces 144 and 146 respectively. The surfaces 326 and 328 are spaced a distance in from the top and bottom sides of the plate 316 and are located nearer to the adjacent top or bottom side of the plate 316 as compared to the surfaces 144 and 146. This increases the length of the contact projection 322 along the end wall 318 as compared to a contact projection 138. The surfaces 326, 328 extend a distance into the passage 316 less than the surfaces 144 and 146. This decreases the distance the contact projection 322 extends into the passage 316 as compared to a projection 138.

The contact retention projections 324 each include sloped upper and lower contact retention surfaces 330 and 332 respectively. The retention surfaces 330, 332 are spaced a distance 333 in from the top and bottom sides of the plate 316 and extend into the passage 316 to the free end of the projection 324. Retention surface 330 faces the top side of the plate and retention surface 332 faces the bottom side of the plate. The retention surfaces 330, 332 are flat, generally planar surfaces and slope at an angle 335 with respect to the axis of the passage 316. Angle 335 is preferably about eight degrees.

The metal contacts 314 each include a central portion 334 having a retention recess 336 that is conformed to receive a contact retention projection 322. Because the retention projections 322 are shallower and longer than retention projections 138, the retention recess 336 is shallower and longer than the corresponding retention recess 152 in a contact 114. This enables the contacts 314 to be more easily manufactured than the contacts 114 from thin metal material. Upper and lower spring arms 338 join the central portion 334. Curved contact noses 340 are provided on the outer ends of the arms 338. Legs 342 extend inwardly from the noses to rounded free ends 344.

A contact 314 is inserted into the passage in essentially the same manner as contact 114 or 214. The contact 314 is moved into the passage 316 and a cam follower on the lower spring arm 338 is guided by the camming surface 326 to the end of the projection 322. The rounded end of the lower leg 342 engages the upper contact retention surface 330 and the leg is elastically bent inwardly to enable the lower leg to enter the reduced passage portion 325. The outer convex surface of the end of the lower leg 342 is a cam follower guided by a camming surface portion of the upper retention surface 330 to the end of the projection 324. The rounded cam follower end of the lower leg slides smoothly along the surface 330 and does not bind or catch.

The contact is then moved further into the passage and the lower spring arm 338 is elastically stressed as the lower cam follower on the arm moves past projection 322 and then snaps back under the lower contact retention surface of the projection 322. At the same time the cam follower end on the lower leg 342 moves to the end of the projection 324 and snaps back under the lower contact retention surface 332. The cam follower on the lower leg 342 then slides smoothly along the lower retention surface 332 and does not bind or catch. The minimum width of the narrowed passage portion 325 is preferably the same as the width of the passage portion 140 so that the elastic bending of the contacts 314 during insertion is about the same as inserting the contacts in single-projection passages.

If desired, contacts 314 could be inserted into the plate from the bottom side 320 in the same manner as previously described.

When the contacts 314 are inserted in the passages 316 each contact is confined and effectively centered within a passage regardless of the orientation of the plate 312. See FIG. 20. The first retention projections 322 extend into the conforming retention recesses 336. Each contact 314 is elastically squeezed or compressed between the projections 322 and 324. The resiliency of the contact biases the free ends 344 of the upper and lower legs 342 against the upper and lower retention surfaces 330 and 332 respectively and the upper and lower contact retaining portions are pressed against the end wall 322.

FIG. 21 illustrates the interposer assembly 310 fully sandwiched between upper and lower circuit members 346 and 348 with contact pads 350 and 352 on the members located above and below a contact 314 in the assembly. When the circuit members are brought into contact with the assembly 310 the contact pads reduce the height of the contact 314 to a minimum and elastically bend the tapered, cantilevered spring arms 338 into the passage 316. The upper and lower contact ends 344 move away from the upper and lower retention surfaces 330, 332 of the projection 324 and do not engage the plate 312. The ends of the contacts remain spaced from the passage walls and enable the spring arms to maintain reliable low resistance pressure connections between contact pads as previously described.

In the illustrated embodiments the thickness of each of the plates 112, 212 and 312 is about 0.048 inches. The length of each contact projection 138 along an end wall 122 is about 0.025 inches, the length of each first contact projection 322 along an end wall 318 is about 0.030 inches and the length of each second contact projection 324 along an end wall 320 is about 0.040 inches. The contact projections 138 each extend into a passage 116 about 0.005 inches. The first contact projections 322 each extend into a passage 316 about 0.0028 inches and the second contact projections 324 each extend into a passage 316 about 0.0022 inches.

In all embodiments, a single contact is located in each contact passage. Contact retention projections are located in the center of the contact passages, obstruct the passages and are spaced inwardly from the opposing top and bottom sides of the plate. As illustrated, each passage has a uniform transverse cross section with the exception of the projections. The passages extend between opposed pairs of first and second end walls, with one end wall having a reduced width to maintain the vertical alignment of the contacts. The projections can extend into the passages from either or both of the first and second end walls. When each embodiment contact is fully inserted into a passage the cam follower on the contact which engaged the projection camming surface during insertion faces away from the camming surface on the projection in the passage. Each contact is symmetrical to either side of the central portion.

While I have illustrated and described preferred embodiments of my invention, it is understood that this is capable of modification, and I therefore do not wish to be limited to the precise details set forth, but desire to avail myself of such changes and alterations as fall within the purview of the following claims.

What I claim as my invention:

1. An interposer component adapted to receive a plurality of like metal contacts to form an interposer assembly for establishing electrical connections between pairs of opposed contact pads arranged in a pattern, said interposer component comprising:

a plate formed from a single piece of insulating material;

said plate having a flat top surface, a flat bottom surface extending parallel to the top surface and a uniform thickness;

a plurality of single contact passages extending through the thickness of the plate from the top surface to the bottom surface thereof, said passages spaced apart from each other and arranged in a pattern corresponding to the pattern of the pairs of opposed contact pads;

each passage being elongate in transverse cross section and including opposed first and second passage ends, said first passage end being wider than said second passage end, a pair of opposed generally parallel walls joining the first passage end and extending toward the second passage end, and a pair of opposed converging walls joining the parallel walls and extending to the second passage end, said parallel walls defining a uniform width portion of the passage adjacent the first passage end and said converging walls defining a reduced width portion of the passage adjacent the second passage end, and a plurality of first projections integrally formed from the insulating material, each projection located in a passage within the thickness of the plate and extending from one of said passage ends a distance into the passage to a projection end, said projection end spaced from the other of said passage ends to define a narrowed passage portion therebetween so that the projection obstructs said passage mediate said top and bottom surfaces, each projection including a first contact camming surface facing the top surface of the plate and sloping from the projection end toward the top surface of the plate and a first contact retention surface facing the bottom surface of the plate, said projection end located between the camming surface and the retention surface.

2. The interposer component as in claim 1 wherein the end of each projection extends completely across a passage at said one of said passage ends.

3. The interposer component as in claim 1 wherein each projection extends into a passage from a first end of such passage.

4. The interposer component as in claim 1 wherein each projection extends into a passage from a second end of such passage.

5. The interposer component as in claim 1 wherein in each passage the distance between said first and second ends is approximately two times the distance between the parallel walls.

6. The interposer component as in claim 1 wherein said projections are symmetrical to either side of a plane parallel to the top and bottom surfaces.

7. The interposer component as in claim 1 wherein each projection is located equidistant between the top and bottom surfaces and is symmetrical to either side of a plane located equidistant between the top and bottom surfaces.

8. The interposer component as in claim 1 wherein in each projection, the first retention surface comprises a second camming surface and the first camming surface comprises a second retention surface, wherein contacts may be inserted into the passages from either the top surface or bottom surface of the plate.

9. The interposer component as in claim 8 wherein said camming and retention surfaces are flat and extend at an angle of about 27° to the axis of the passage.

10. The interposer component as in claim 1 wherein said interposer component comprises a plurality of second projections integrally formed from the insulating material, each second projection located in a passage within the thickness of the plate opposite a first projection and extending from the other of said first and second passage ends a distance into the passage to a second projection end.

11. The interposer component as in claim 10 wherein each first projection extends a first distance from the first end into a passage and each second projection extends a second distance from the second end into a passage, said first distance being greater than said second distance.

12. An interposer assembly including the interposer component as in claim 1 and a plurality of metal contacts, each contact disposed in a passage in the interposer component between the parallel walls and the converging walls; and each of said metal contacts comprising a central portion and a pair of flexible spring members joining the central portion and having outer ends, a pair of contact noses located on the outer ends of the spring members, a pair of legs extending inwardly from the outer ends toward a passage end, two retention portions, and a cam follower facing away from the contact camming surface on the projection in passage in which the contact is disposed, the projection in each passage located between the retention portions of the contact in the passage, said central portion positioned adjacent to one end of the passage, said contact noses normally being spaced apart a distance greater than the thickness of the plate when the contact is not sandwiched between the circuit members;

wherein upon insertion of said contacts into said passages towards said camming surfaces the cam followers engage the camming surfaces, are cammed past the projections and snap back behind the projections.

13. The interposer assembly as in claim 12 wherein the projection in each passage is located between the legs of the contact in the passage.

14. The interposer assembly as in claim 12 wherein the central portion of each contact is flat and engages a first end.

15. The interposer assembly as in claim 12 wherein said contacts are formed from sheet metal stock and each spring member comprises a bowed, tapered arm.

16. The interposer assembly as in claim 15 wherein each contact includes a rounded end on each leg.

17. The interposer assembly ag in claim 12 wherein each contact includes a retention recess in the central portion thereof and the projection in each passage extends into the retention recess of the contact in the passage.

18. The interposer assembly as in claim 17 wherein each projection extends from the first end of a passage, the central portion of each contact is located adjacent the first end of a passage and the contact legs are located adjacent the second end of such passage.

19. An interposer component adapted to receive a plurality of like metal contacts to form an interposer assembly for establishing electrical connections between pairs of opposed contact pads arranged in a pattern, the interposer component comprising:

a plate formed from insulating material;

said plate having a flat top surface, a flat bottom surface parallel to the top surface and uniform thickness;

a plurality of single contact passages extending through the thickness of the plate from the top surface to the bottom surface thereof, said passages spaced apart from each other and arranged in a pattern corresponding to the pattern of the pairs of contact pads;

each passage having opposed first and second ends, said ends extending between said top and bottom surfaces; and a plurality of first projections formed from the insulating material, each first projection extending from the first of said passage ends a distance into the passage towards the second end, each first projection including a contact camming surface facing the top surface of the plate;

a plurality of second projections formed from the insulating material, each second projection extending from the second of said passage ends a distance into the passage towards the first end to a second projection end, each second projection including a first contact retention surface facing the top surface of the plate; and each of said first and second projections in a, passage spaced a distance apart to define a narrowed passage portion therebetween so that the first and second projections obstruct said passage.

20. The interposer component as in claim 19 wherein said first projections are symmetrical to either side of a plane parallel to the top and bottom surfaces.

21. The interposer component as in claim 19 wherein sail first projections are equidistant between the top and bottom surfaces and are symmetrical to either side of a plane centered between the top and bottom surfaces.

22. The interposer component as in claim 19 wherein the first end of each passage is wider than the second end of such passage.

23. The interposer component as in claim 19 wherein each of said first contact retention surfaces include a camming portion.

24. The interposer component as in claim 19 wherein each first projection includes a second retention surface, the first retention surface comprises a second camming surface and the first camming surface comprises a second retention surface, wherein contacts may be inserted into the cavities from either the top surface or bottom surface of the plate.

25. The interposer component as in claim 19 wherein each second projection includes a second contact retention surface facing the bottom of the plate.

26. The interposer component as in claim 25 wherein said first and second contact retention surfaces are substantially flat and extend at a shallow angle to the axis of the passage.

27. An interposer assembly including the interposer component as in claim 19 and a plurality of metal contacts with a single contact disposed in each said passage between the ends of the passage; and each of said metal contacts comprising a central portion and a pair of flexible spring members joining the central portion and having outer ends, a pair of contact noses located on the outer ends of the spring members and a first cam follower facing away from the camming surface on the first projection in the passage in which the contact is disposed, said contact noses normally being spaced apart a distance greater than the thickness of the plate when the contact is unstressed;

wherein upon insertion of said contacts into said passages towards said camming surfaces the first cam followers engage the camming surfaces, are cammed past the first projections and snap back behind the first projections.

28. The interposer assembly as in claim 27 wherein each contact includes a second cam follower and each second projection includes a contact camming surface;

wherein upon insertion of said contacts into said passages the second cam followers engage the camming surfaces on the second projections, are cammed past the second projections and snap back behind the second projections.

29. The interposer assembly as in claim 27 wherein each contact comprises a pair of legs extending inwardly from the outer ends of the spring arms wherein a projection in each passage is located between the legs of the contact in the passage.

30. The interposer assembly as in claim 27 wherein the central portion of each contact includes a retention recess and a projection in each passage extends into the retention recess of the contact in the passage.

31. An interposer assembly for establishing electrical connections between pairs of opposed contact pads arranged in a pattern on circuit members, the interposer assembly comprising:

an interposer component comprising a plate formed from insulating material, said plate having a flat top surface, a flat bottom surface parallel to the top, surface and a uniform thickness, a plurality of single contact passages extending through the thickness of the plate from the top surface to the bottom surface thereof, said passages spaced apart from each other and arranged in a pattern corresponding to the pattern of the pairs of contact pads, each passage having opposed first and second ends, said ends extending between said top and bottom surfaces, a plurality of first projections formed from the insulating material, each projection extending from the first end a distance into the passage towards the second end to define a narrowed passage portion therebetween so that the projection obstructs said passage mediate said top and bottom surfaces and including a first contact camming surface facing the top surface of the plate and sloping from the projection end toward the top surface of the plate and a first contact retention surface facing the bottom surface of the plate;

a plurality of metal contacts with a single contact disposed in each said passage, each of said metal contacts comprising a central portion having a retention recess and a pair of flexible spring members joining the central portion and having outer ends, a pair of contact noses located on the outer ends of the spring members, said contact noses normally being spaced apart a distance greater than the thickness of the plate when the contact is not sandwiched between the circuit members; and the projection in each passage extending into the retention recess of the contact in the passage.

32. The interposer assembly as in claim 31 wherein said contacts are symmetrical to either side of a plane parallel to the top and bottom surfaces.

33. The interposer assembly as in claim 31 wherein the spring members of each contact are elastically compressed between the first and second ends of the passage in which the contact is disposed when the interposer assembly is not sandwiched between the circuit members.

34. The interposer assembly as in claim 31 wherein each contact is loosely retained in a passage.

35. The interposer assembly as in claim 31 wherein each of said spring members comprises a bowed, tapered arm.

36. The interposer assembly as in claim 31 wherein each contact comprises a pair of legs extending from the outer ends of the spring members towards the second end of the passage in which the contact is disposed.

37. The interposer assembly as in claim 31 wherein each contact compresses a retention leg extending from each contact nose toward the second end of a passage; and said spring members of each contact are elastically stressed between the ends of the passage in which the contact is disposed when the interposer assembly is not sandwiched between the circuit members to hold said retaining legs against said first end of the passage and to hold said contact legs against said second end of the passage.

38. The interposer assembly as in claim 31 wherein each spring member of each contact comprises a cantilever spring when the interposer assembly is sandwiched between the circuit members.

39. The interposer assembly as in claim 31 comprising a plurality of second projections integrally formed from the insulating material, each second projection located in a passage within the thickness of the plate and extending from the second end of such passage a distance into the passage to a second projection end, the ends of said first and second projections in a passage spaced from one another and narrowing said passage portion.

40. The interposer assembly as in claim 39 wherein each contact comprises a pair of retention legs extending from the outer ends of the spring members towards the second end of the passage in which the contact is disposed and the second projection in the passage is located between said retention legs.

41. The interposer assembly as in claim 38 wherein at least one of the retention legs of each contact engages the second projection in the passage in which the contact is disposed.

42. The interposer assembly as in claim 41 wherein each contact comprises a pair of retaining portions on opposite sides of the first projection in the passage in which the contact is disposed and said retaining portions engage at least one of said first projection and said first end of said passage.

* * * * *